(12) United States Patent
Kim (10) Patent No.: US 11,412,625 B2
(45) Date of Patent: Aug. 9, 2022

(54) DISPLAY DEVICE

(71) Applicant: SAMSUNG DISPLAY CO., LTD., Yongin (KR)

(72) Inventor: Se Bong Kim, Asan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/726,541

(22) Filed: Dec. 24, 2019

(65) Prior Publication Data

US 2020/0344897 A1 Oct. 29, 2020

(30) Foreign Application Priority Data

Apr. 24, 2019 (KR) .................. 10-2019-0047746

(51) Int. Cl.
| | |
|---|---|
| H05K 5/00 | (2006.01) |
| H05K 5/02 | (2006.01) |
| H01L 51/52 | (2006.01) |
| H01L 27/32 | (2006.01) |
| H01L 51/00 | (2006.01) |

(52) U.S. Cl.
CPC ......... H05K 5/0017 (2013.01); H01L 51/524 (2013.01); H05K 5/0004 (2013.01); H05K 5/0226 (2013.01); *H01L 27/3244* (2013.01); *H01L 51/0097* (2013.01); *H01L 2251/5338* (2013.01)

(58) Field of Classification Search
CPC .. H05K 5/0017; H05K 5/0004; H05K 5/0226; H01L 51/524; H01L 27/3244; H01L 51/0097; H01L 2251/5338; H01L 27/3258; H01L 27/3262; Y02E 10/549; G06F 1/1652; G06F 1/1641; G06F 2203/04102; G09F 9/301
See application file for complete search history.

(56) References Cited

U.S. PATENT DOCUMENTS

| | | | |
|---|---|---|---|
| 10,314,184 B2 | 6/2019 | Choi et al. | |
| 10,540,026 B2* | 1/2020 | Park | H05K 5/0017 |
| 2012/0307423 A1 | 12/2012 | Bohn et al. | |
| 2015/0089974 A1* | 4/2015 | Seo | A44C 5/0076 |
| | | | 63/1.13 |
| 2015/0207102 A1* | 7/2015 | Jeong | H04M 1/0268 |
| | | | 257/40 |
| 2016/0103539 A1* | 4/2016 | Jinbo | G06F 1/1652 |
| | | | 345/173 |
| 2016/0195901 A1* | 7/2016 | Kauhaniemi | G06F 1/1681 |
| | | | 361/679.27 |

(Continued)

FOREIGN PATENT DOCUMENTS

| | | |
|---|---|---|
| KR | 10-2017-0957500 | 5/2017 |
| KR | 10-1844432 | 4/2018 |

(Continued)

*Primary Examiner* — Abhishek M Rathod
(74) *Attorney, Agent, or Firm* — F. Chau & Associates, LLC (57) ABSTRACT

A display device includes a display module that includes a first non-folding area, a second non-folding area, and a folding area disposed between the first and second non-folding areas, a supporter disposed below the display module, a sub-supporter disposed below the supporter, and a plurality of joint units disposed below the sub-supporter and that overlap the folding area.

18 Claims, 9 Drawing Sheets

(56) References Cited

U.S. PATENT DOCUMENTS

| | | | |
|---|---|---|---|
| 2016/0233453 | A1 | 8/2016 | Lee et al. |
| 2017/0861836 | | 3/2017 | Kim et al. |
| 2017/0142847 | A1 | 5/2017 | Park |
| 2018/0090698 | A1* | 3/2018 | Jeong .................. H01L 27/3276 |
| 2018/0124931 | A1* | 5/2018 | Choi ...................... G06F 1/1652 |
| 2018/0242466 | A1 | 8/2018 | Lee et al. |
| 2018/0297707 | A1 | 10/2018 | Gharia et al. |
| 2018/0307338 | A1 | 10/2018 | Park |
| 2019/0061318 | A1* | 2/2019 | Jung ................. G02F 1/133305 |
| 2019/0082544 | A1 | 3/2019 | Park |
| 2019/0090364 | A1* | 3/2019 | Shin ...................... G06F 1/1681 |
| 2019/0107866 | A1* | 4/2019 | Han ...................... G06F 1/1618 |
| 2019/0204873 | A1* | 7/2019 | Kim ...................... G06F 3/0412 |

FOREIGN PATENT DOCUMENTS

| | | |
|---|---|---|
| KR | 10-2018-0049856 | 5/2018 |
| KR | 10-2018-0097195 | 8/2018 |

* cited by examiner

DISPLAY DEVICE

CROSS-REFERENCE TO RELATED APPLICATIONS

This U.S. non-provisional patent application claims priority under 35 U.S.C. § 119 from, and the benefit of, Korean Patent Application No. 10-2019-0047746, filed on Apr. 24, 2019 in the Korean Intellectual Property Office, the contents of which are herein incorporated by reference in their entirety.

BACKGROUND

Embodiments of the present disclosure herein are directed to a display device, and more particularly, to a display device in which can prevent deformation in a folding area.

Electronic apparatuses that display an image to a user, such as smart phones, digital cameras, laptop computers, navigation devices, and smart televisions, include a display device that displays the image. The display device generates an image and displays the image to the user via a display screen.

Recent technological developments for display devices have enabled the development of various new types of display devices. For example, various flexible display devices that can be deformed, folded, or rolled into a curved shape are being developed. Flexible display devices that can change their shapes are easily portable and can improve a user's convenience.

A folding display device is folded with respect to a folding axis that extends in one direction. However folding display devices can experience unexpected phenomena, such as deformations in the folding area or damage to parts of the folding area.

SUMMARY

Embodiments of the present disclosure can provide a display device in which folding area deformation can be prevented.

An embodiment of the inventive concept provides a display device that includes: a display module that includes a first non-folding area, a second non-folding area, and a folding area disposed between the first non-folding area and the second non-folding area; a supporter disposed below the display module; a sub-supporter disposed below the supporter; and a plurality of joint units disposed below the sub-supporter and that overlap the folding area.

In an embodiment of the inventive concept, a display device includes: a display module that includes a first non-folding area, a second non-folding area, and a folding area disposed between the first non-folding area and the second non-folding area, wherein the first and second non-folding areas and the folding area are arranged in a first direction; a supporter disposed below the display module; an adhesive disposed between the display module and the supporter; a sub-supporter disposed below the supporter; and a plurality of joint units which protrude downward from the sub-supporter and that overlap the folding area, wherein the joint units extend in a second direction that crosses the first direction and are spaced apart in the first direction.

In an embodiment of the inventive concept, a display device includes: a display module that includes a first non-folding area, a second non-folding area, and a folding area disposed between the first non-folding area and the second non-folding area; a supporter disposed below the display module; a sub-supporter disposed below the supporter; and a plurality of joint units which protrude downward from the sub-supporter and that overlap the folding area. A Young's modulus of the supporter has a first value and a Young's modulus of the sub-supporter has a second value less than the first value.

DETAILED DESCRIPTION

In this specification, when a component, region, layer, portion, etc., is referred to as "being on", "being connected to", or "being coupled to" another component, it may be directly disposed/connected/coupled to another component, or an intervening third component may be also disposed therebetween.

Like numbers may refer to like elements throughout. In the drawings, the thicknesses, ratios, and dimensions of the components may be exaggerated to more effectively illustrate the technical features.

Herein, when one value is described as being about equal to another value, it is to be understood that the values are equal to each other to within a measurement error, or if measureably unequal, are close enough in value to be functionally equal to each other as would be understood by a person having ordinary skill in the art.

Hereinafter, embodiments of the present disclosure will be described in detail with reference to the accompanying drawings.

Figure 1:
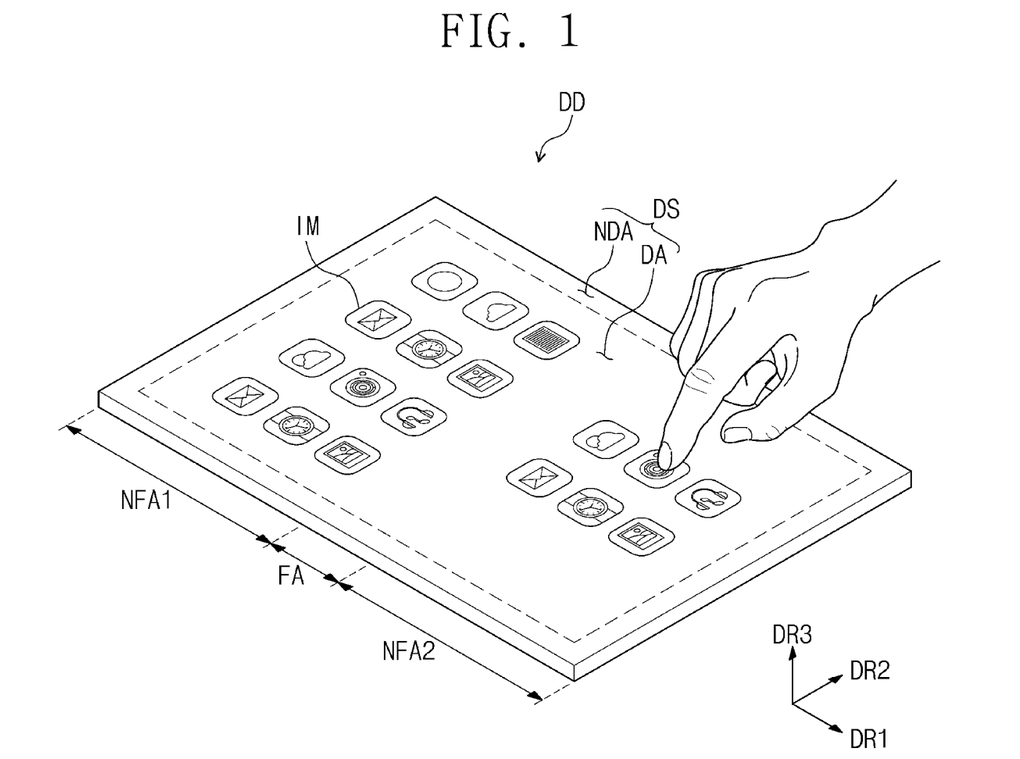
FIG. 1 is a perspective view of a display device according to an embodiment of the inventive concept.
Figure 2:
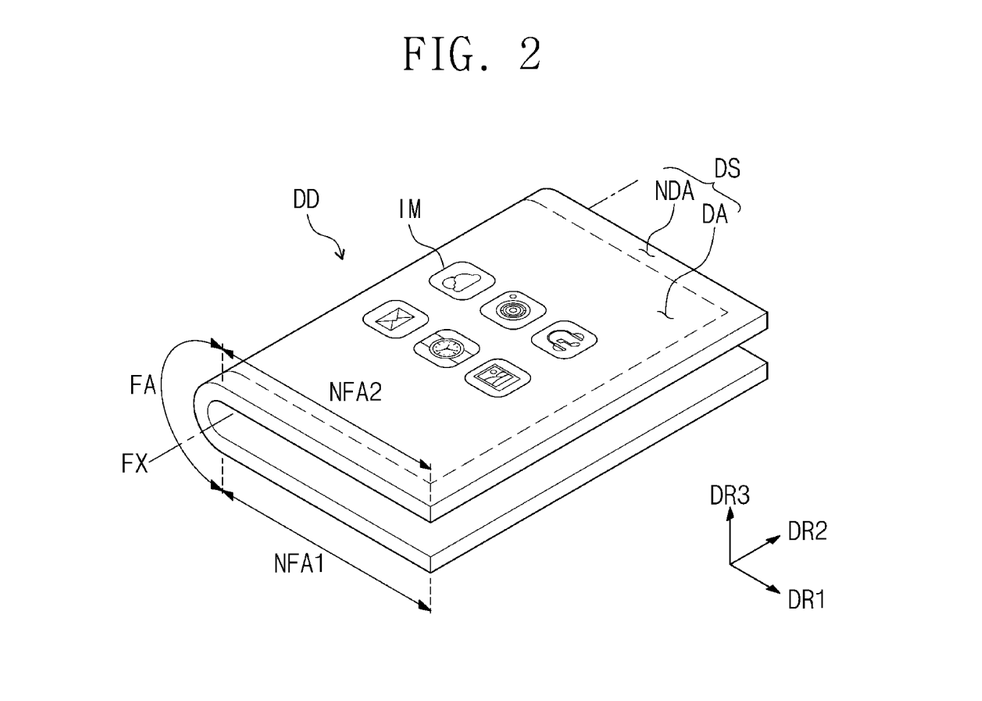
FIG. 2 illustrates a folded state of a display device illustrated in FIG. 1.

FIG. 1 is a perspective view of a display device according to an embodiment of the inventive concept. FIG. 2 illustrates a folded state of a display device illustrated in FIG. 1.

Referring to FIG. 1, a display device DD according to an embodiment of the inventive concept has a rectangular shape with long sides in a first direction DR1 and short sides in a second direction DR2 that crosses the first direction DR1. However, embodiments of the inventive concept are not limited thereto, and in other embodiments, the display device DD can have various other shapes, such as a circle and a polygon. The display device DD is a flexible display device.

Hereinafter, a direction substantially normal to a plane defined by the first direction DR1 and the second direction DR2 is referred to as a third direction DR3. In this description, the meaning of "when viewed in a plane" means being viewed in the third direction DR3.

According to an embodiment, the display device DD includes a first non-folding area NFA1, a second non-folding area NFA2, and a folding area FA disposed between the first non-folding area NFA1 and the second non-folding area NFA2. The first non-folding area NFA1, the second non-folding area NFA2, and the folding area FA are arranged in the first direction DR1.

Although the figure shows one folding area FA and two non-folding areas NFA1 and NFA2, the number of folding areas FA and non-folding areas NFA1 and NFA2 are not limited thereto. In other embodiments, the display device DD may include more than two, for example, a plurality of non-folding areas and a plurality of folding areas disposed between the non-folding areas.

According to an embodiment, the top surface of the display device DD is a display surface DS, and is coplanar with a plane defined by the first direction DR1 and the second direction DR2. Through the display surface DS, images IM generated in the display device DD are displayed to a user.

According to an embodiment, the display surface DS includes a display area DA and a non-display area NDA adjacent to the display area DA. The display area DA displays images, and the non-display area NDA does not display images. The non-display area NDA surrounds the display area DA, and has an edge with a predetermined color.

Referring to FIG. 2, according to an embodiment, the display device DD is a foldable display device DD that can be folded or unfolded. For example, the folding area FA is curved with respect to a folding axis FX parallel to the second direction DR2, and thus the display device DD can be folded. The folding axis FX is a short axis parallel to the short sides of the display device DD.

According to an embodiment, the display device DD can be out-folded so that the display surface DS is externally exposed. Thus, when the display device DD is folded, the first non-folding area NFA1 and the second non-folding area NFA2 are positioned opposite to each other.

Figure 3:
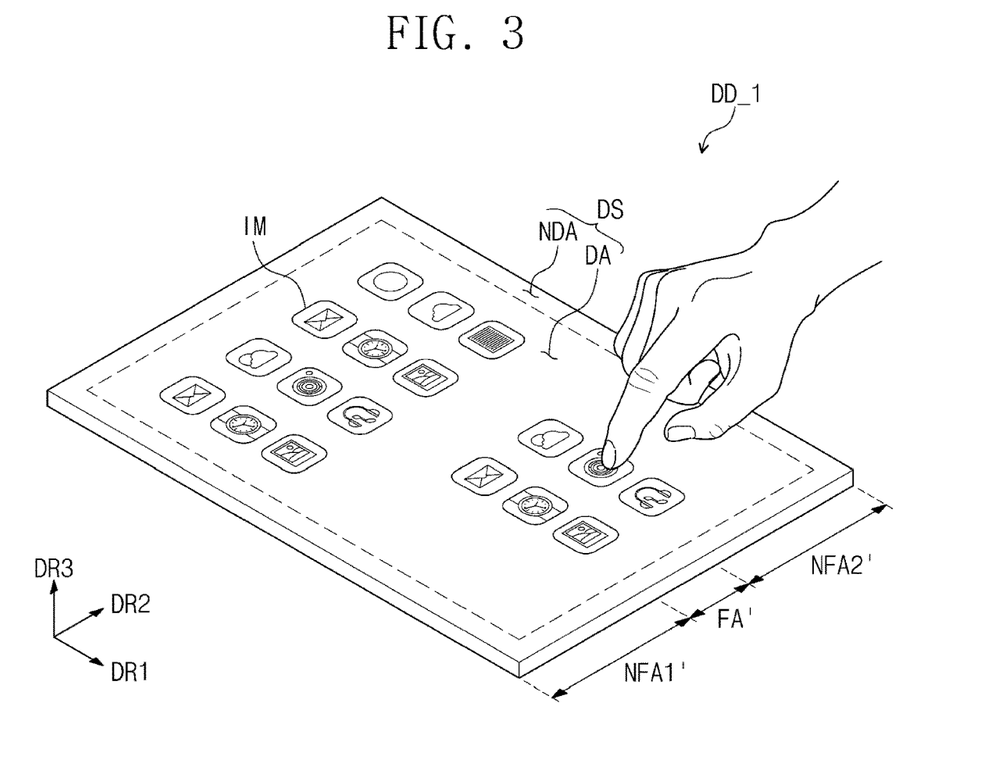
FIG. 3 is a perspective view of a display device according to an embodiment of the inventive concept.
Figure 4:
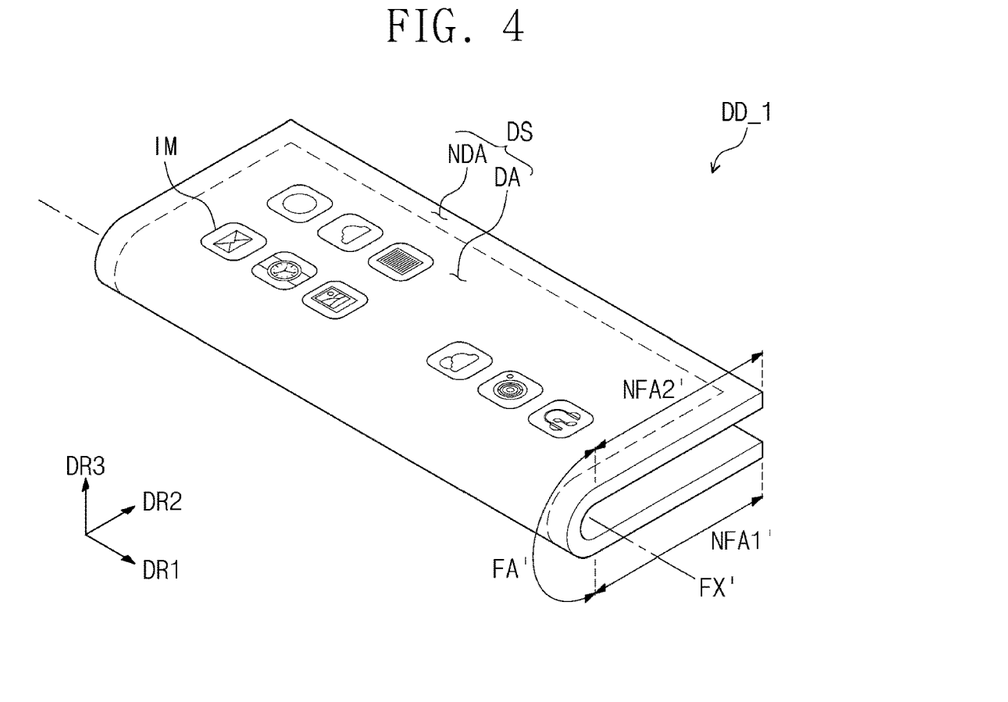
FIG. 4 illustrates a folded state of a display device illustrated in FIG. 3.

FIG. 3 is a perspective view of a display device according to an embodiment of the inventive concept. FIG. 4 illustrates a folded state of a display device illustrated in FIG. 3.

According to an embodiment, except for a folding operation, a display device DD_1 illustrated in FIG. 3 has substantially the same configuration as the display device DD illustrated in FIG. 1. Thus, the folding operation of the display device DD_1 will be mainly described hereinafter.

Referring to FIG. 3 and FIG. 4, according to an embodiment, the display device DD_1 includes a first non-folding area NFA1', a second non-folding area NFA2', and a folding area FA' disposed between the first non-folding area NFA1' and the second non-folding area NFA2'. The first non-folding area NFA1', the second non-folding area NFA2', and the folding area FA' are arranged in a second direction DR2.

According to an embodiment, the folding area FA' is curved with respect to a folding axis FX' parallel to a first direction DR1, and thus the display device DD_1 can be folded. The folding axis FX' is a long axis parallel to long sides of the display device DD_1. The display device DD illustrated in FIG. 1 can be folded with respect to the short axis, but on the other hand, the display device DD_1 illustrated in FIG. 3 can be folded with respect to the long axis. The display device DD_1 can be folded so that a display surface DS can be externally exposed.

Hereinafter, a structure of the display device DD folded with respect to the short axis will be described. However, embodiments of the inventive concept are not limited thereto, and structures described hereinafter can be incorporated into the display device DD_1 folded with respect to the long axis.

Figure 5:
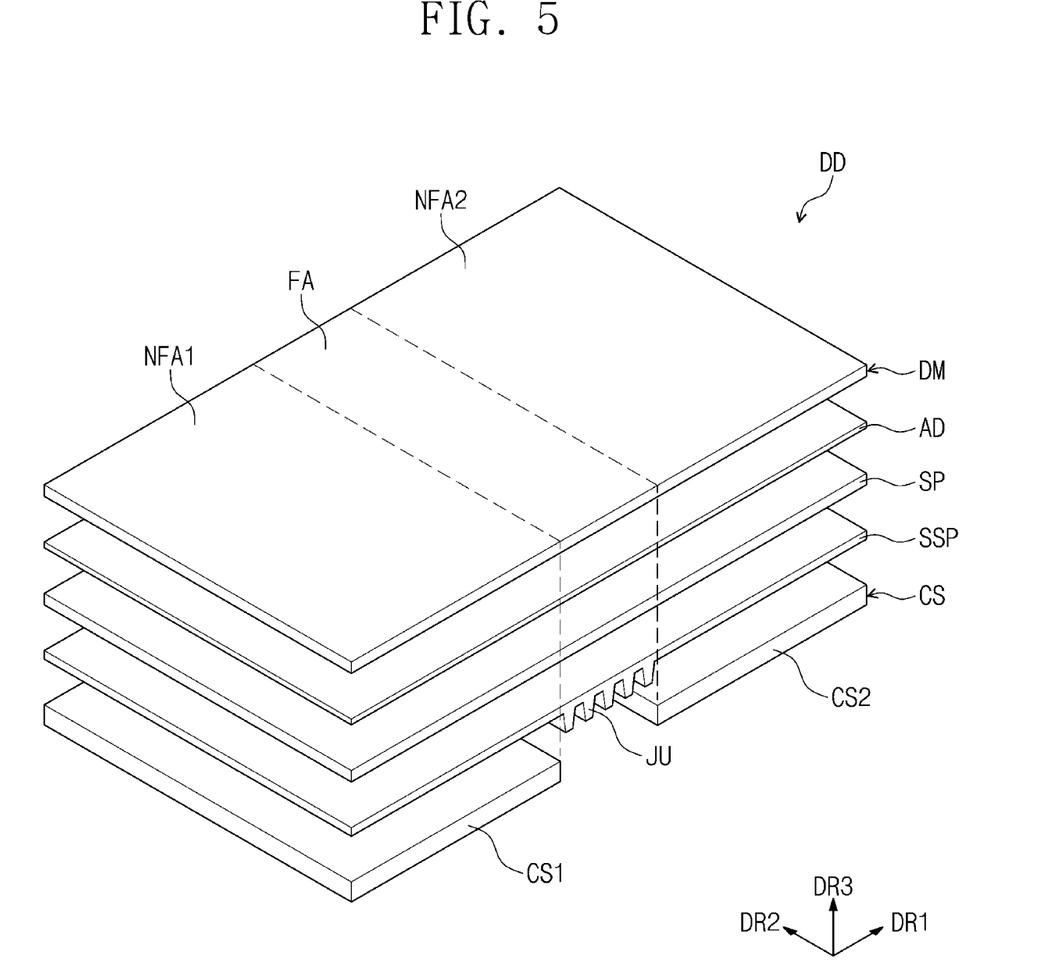
FIG. 5 is an exploded perspective view of a display device according to an embodiment of the inventive concept.
Figure 6:
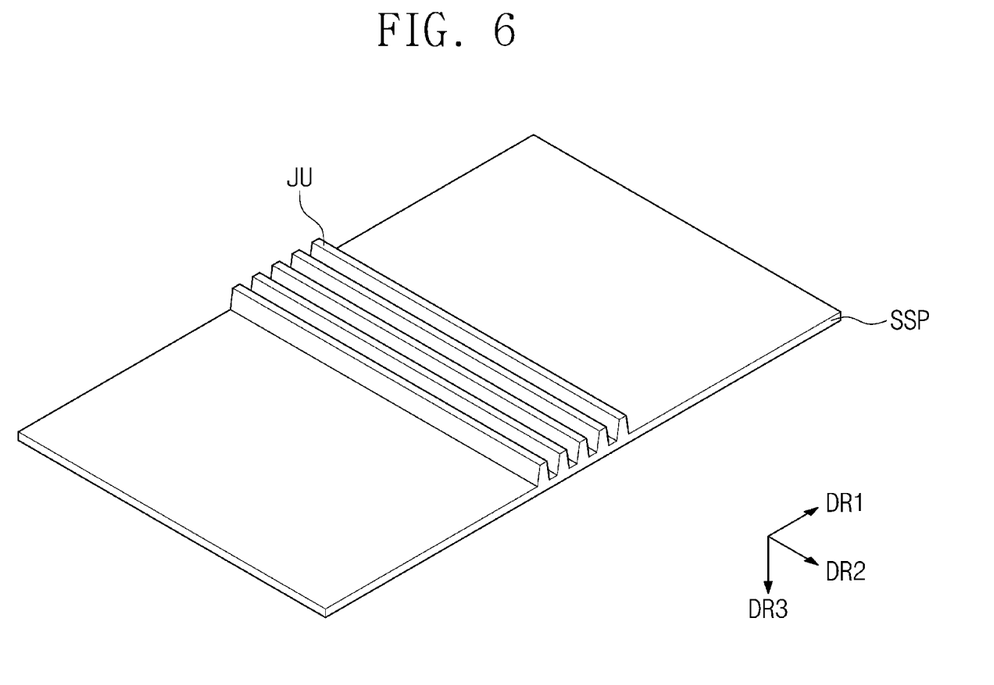
FIG. 6 is a perspective view of joint units illustrated in FIG. 5.

FIG. 5 is an exploded perspective view of a display device according to an embodiment of the inventive concept. FIG. 6 is a perspective view of joint units illustrated in FIG. 5.

Referring to FIG. 5 and FIG. 6, a display device DD according to an embodiment of the inventive concept includes a display module DM, an adhesive AD, a supporter SP, a sub-supporter SSP, a plurality of joint units JU, and a case or housing CS. For convenience of explanation, the sub-supporter SSP and the joint units JU in FIG. 6 are illustrated upside down as compared to FIG. 5.

According to an embodiment, the display module DM forms a plane defined by first and second directions DR1 and DR2. The display module DM has a rectangular shape with long sides in the first direction DR1 and short sides in the second direction DR2.

According to an embodiment, like the display device DD, the display module DM includes a first non-folding area NFA1, a second non-folding area NFA2, and a folding area FA disposed between the first non-folding area NFA1 and the second non-folding area NFA2. The first and second non-folding areas NFA1 and NFA2 and the folding area FA are arranged in the first direction DR1.

According to an embodiment, the supporter SP has a rectangular shape with long sides in the first direction DR1 and short sides in the second direction DR2. The supporter SP is disposed below the display module DM, and supports the display module DM.

According to an embodiment, the adhesive AD is disposed between the display module DM and the supporter SP. The display module DM and the supporter SP are attached to each other by means of the adhesive AD. The adhesive AD may include a pressure sensitive adhesive, but this is exemplary and non-limiting. The adhesive AD may include various other adhesives in addition to a pressure sensitive adhesive.

According to an embodiment, the sub-supporter SSP has a rectangular shape with long sides in the first direction DR1 and short sides in the second direction DR2. The sub-supporter SSP is disposed below the supporter SP.

According to an embodiment, the joint units JU are disposed below the sub-supporter SSP. The joint units JU overlap the folding area FA of the display module DM. The joint units JU extend in the second direction DR2 and are spaced apart in the first direction DR1. The joint units JU are spaced a predetermined distance from each other in the first direction DR1.

According to an embodiment, the case CS is disposed below the sub-supporter SSP. The case CS includes a first case CS that overlaps the first non-folding area NFA1 and a second case CS2 that overlaps the second non-folding area NFA2.

According to an embodiment, the display device DD further includes a hinge part that provides a folding axis FX that extends in the second direction DR2 and which is connected to the first and second cases CS1 and CS2.

Figure 7:
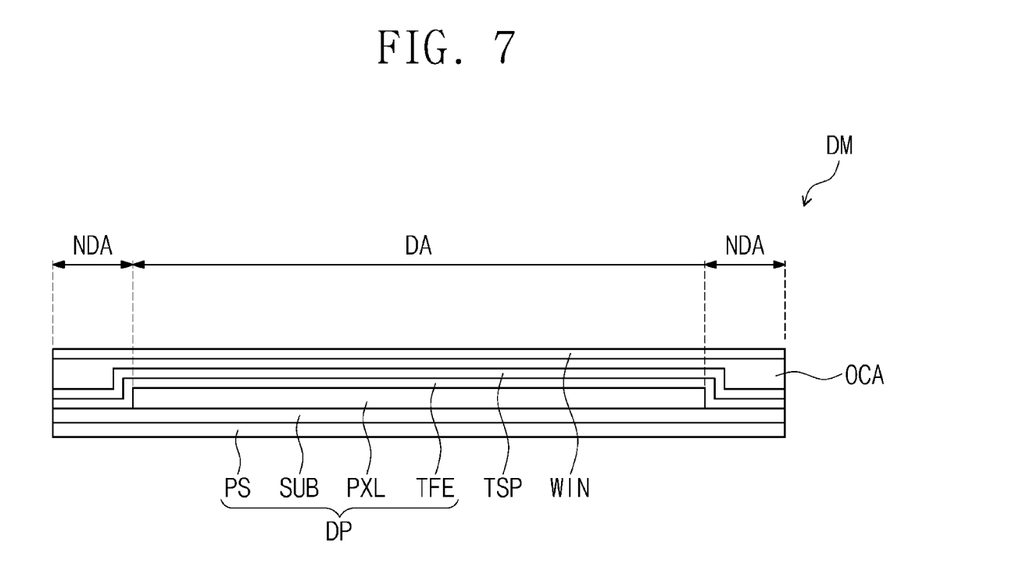
FIG. 7 schematically illustrates a cross-section of a display module illustrated in FIG. 5.

FIG. 7 illustrates a cross-section of a display module illustrated in FIG. 5.

Referring to FIG. 7, according to an embodiment, the display module DM includes a display panel DP, a touch sensing part TSP disposed on the display panel DP, a window WIN disposed on the touch sensing part TSP, and an adhesive OCA disposed between the touch sensing part TSP and the window WIN.

The display panel DP according to an embodiment of the inventive concept is a light emitting-type display panel, but embodiments are not particularly limited thereto. For example, the display panel DP may be an organic light emitting display panel or a quantum-dot light emitting display panel. A light emitting layer of a organic light emitting display panel includes an organic light emitting material. A light emitting layer of a quantum-dot light emitting display panel includes quantum dots, quantum rods, or etc. Hereinafter, the display panel DP is described as an organic light emitting display panel.

According to an embodiment, the display panel DP includes: a substrate SUB; a pixel layer PXL disposed on the substrate SUB; a thin film encapsulation layer TFE disposed on the substrate SUB that covers the pixel layer PXL; and a protection substrate PS disposed below the substrate SUB. The substrate SUB is a transparent substrate that includes a flexible plastic material. For example, the substrate SUB is made of polyimide (P).

Like the display surface DS of the display device DD, according to an embodiment, the substrate SUB includes a display area DA and a non-display area NDA adjacent to the display area DA. The pixel layer PXL is disposed on the display area DA. The pixel layer PXL includes a plurality of pixels, and each of the pixels includes a light emitting element.

According to an embodiment, the thin film encapsulation layer TFE includes at least two inorganic layers and an organic layer disposed between the inorganic layers. The inorganic layers include an inorganic material, and protect the pixel layer PXL against moisture or oxygen. The organic layers include an organic material, and protect the pixel layer PXL against impurities such as dust particles.

According to an embodiment, the protection substrate PS protects a lower portion of the substrate SUB. The protection substrate PS includes a flexible plastic material. For example, the protection substrate PS is made of polyethylene terephthalate (PET).

According to an embodiment, the touch sensing part TSP can detect an external input, such as a user's hand, a touch pen, or etc., change the input into a predetermined input signal, and provide the input signal to the display panel DP. The touch sensing part TSP includes a plurality of touch sensor parts that detect the external input. The touch sensor parts detect the external input using a capacitive method. The display panel DP receives the input signal from the touch sensing part TSP and generates an image corresponding to the input signal.

According to an embodiment, the window WIN protects the display panel DP and the touch sensing part TSP against external scratches and impacts. The window WIN is attached to the touch sensing part TSP by means of the adhesive OCA. The adhesive OCA includes an optically clear adhesive. The image generated in the display panel DP is visible to a user through the window WIN.

Figure 8:
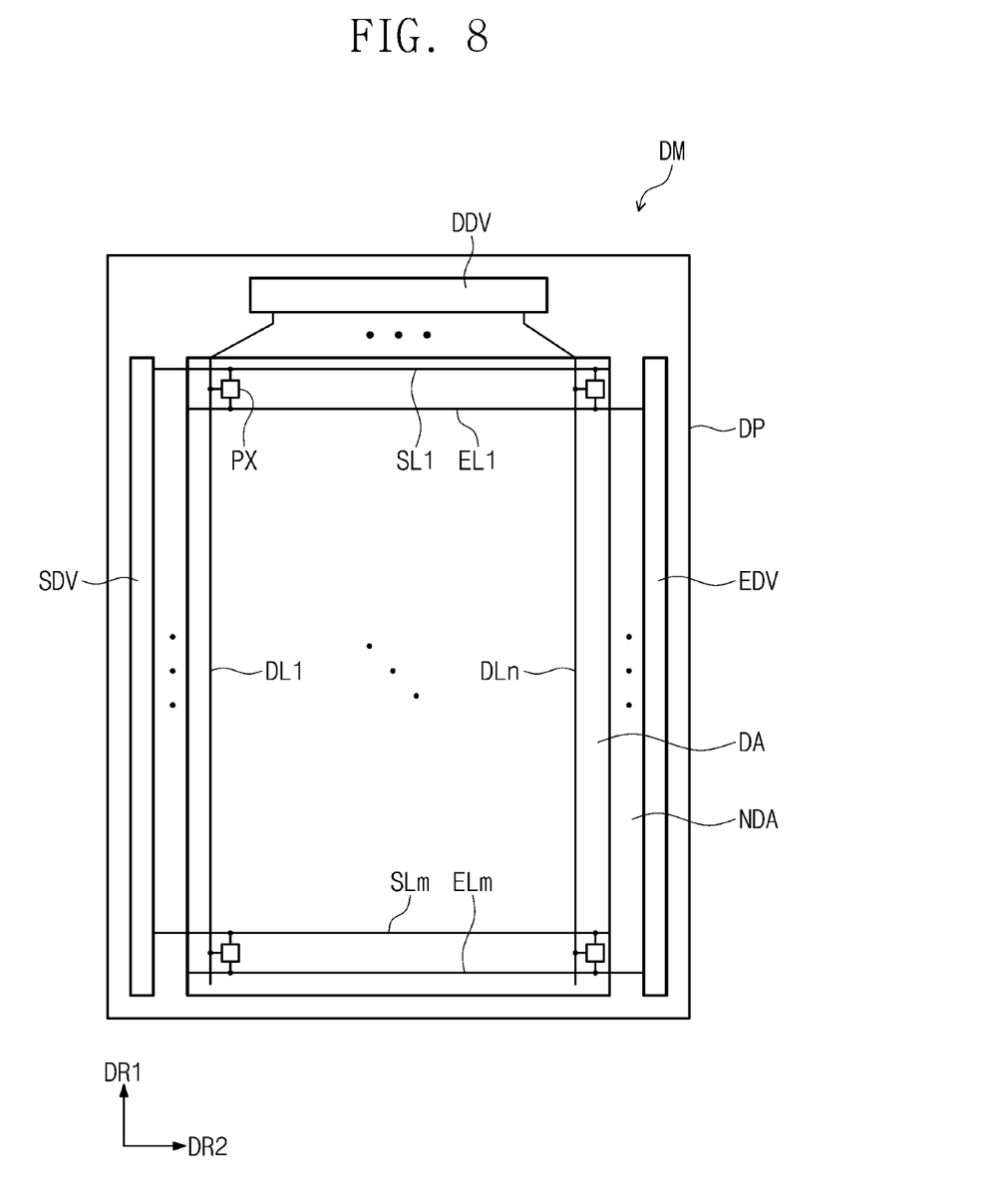
FIG. 8 is a plan view of a display module illustrated in FIG. 7.

FIG. 8 is a plan view of a display module illustrated in FIG. 7.

Referring to FIG. 8, the display module DM according to an embodiment of the inventive concept includes a display panel DP, a scan driver SDV, a data driver DDV, and an emission driver EDV. A planar configuration of the display panel DP illustrated in FIG. 8 is exemplary and non-limiting, and a planar configuration of a touch sensing part TSP is omitted.

According to an embodiment, the display panel DP is a flexible display panel. The display panel DP has a rectangular shape with long sides in a first direction DR1 and short sides in a second direction DR2. Like the display surface DS of the display device DD, the display panel DP includes a display area DA and a non-display area NDA that surrounds the display area DA.

According to an embodiment, the display panel DP includes a plurality of pixels PX, a plurality of scan lines SL1 to SLn, a plurality of data lines DL1 to DLn, and a plurality of light emission lines EL1 to Elm, where m and n are natural numbers. The pixels PX are disposed in the display area DA, and are connected to the scan lines SL1 to SLm, the data lines DL1 to DLn, and the light emission line EL1 to ELm.

According to an embodiment, the scan driver SDV, the data driver DDV, and the emission driver EDV are disposed in the non-display area NDA. Each of the scan driver SDV and the emission driver EDV is disposed adjacent to one of the long sides of the display panel DP. The data driver DDV is an integrated circuit chip, and is disposed adjacent to one of the short sides of the display panel DP.

According to an embodiment, the scan lines SL1 to SLm extend in the second direction DR2 and are connected to the scan driver SDV. The data lines DL1 to DLn extend in the first direction DR1 and are connected to the data driver DDV. The light emission lines EL1 to ELm extend in the second direction DR2 and are connected to the emission driver EDV.

According to an embodiment, the scan driver SDV generates a plurality of scan signals, and the scan signals are transmitted to the pixels PX through the scan lines SL1 to SLm. The scan signals are sequentially transmitted to the pixels PX. The data driver DDV generates a plurality of data voltages, and the data voltages are transmitted to the pixels PX through the data lines DL1 to DLn. The emission driver EDV generates a plurality of light emission signals, and the light emission signals are transmitted to the pixels PX through the light emission lines EL1 to ELm.

In addition, according to an embodiment, the display module DM includes a timing controller that controls operations of the scan driver SDV, the data driver DDV, and the emission driver EDV.

According to an embodiment, the pixels PX receive the data voltages in response to the scan signals. The pixels PX display an image by emitting light having a luminance that corresponds to the data voltages in response to the light emission signals. Light emission times of the pixels PX are controlled by the light emission signals.

Figure 9:
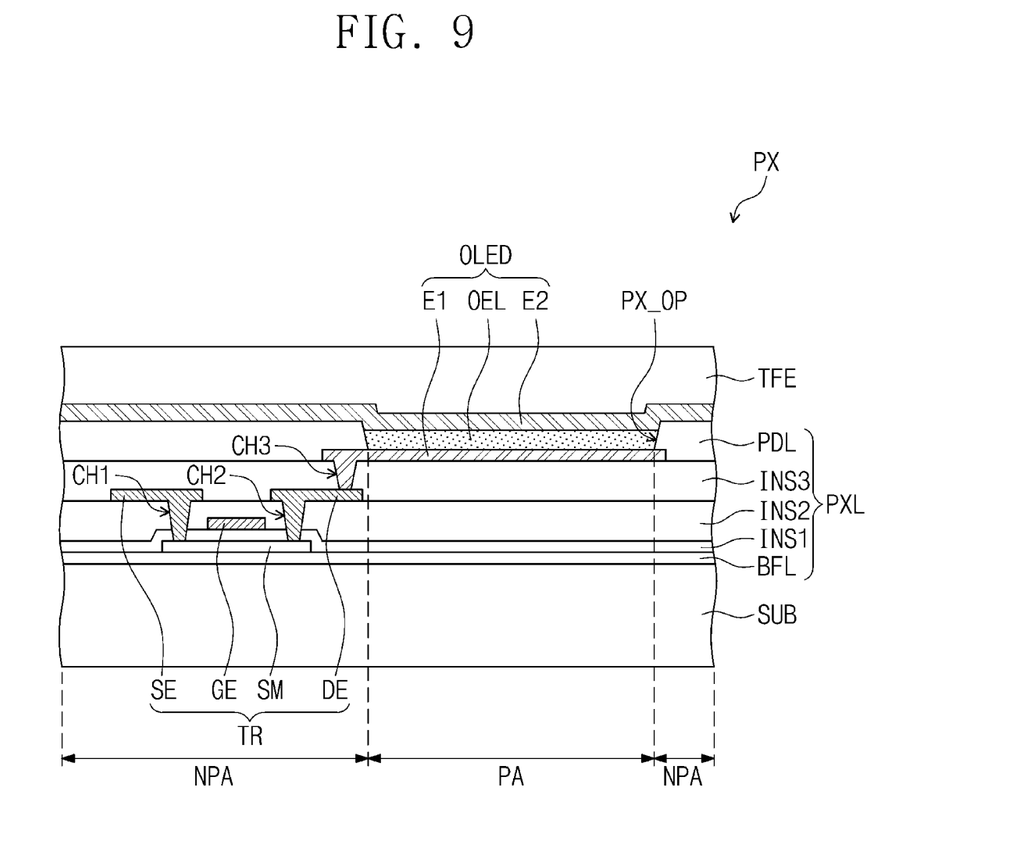
FIG. 9 schematically illustrates a cross-sectional configuration of one pixel illustrated in FIG. 8.

FIG. 9 schematically illustrates a cross-sectional configuration of one pixel illustrated in FIG. 8.

Referring to FIG. 9, according to an embodiment, the pixel PX includes an organic light emitting element OLED and a transistor TR connected to the organic light emitting element OLED. The organic light emitting element OLED includes a first electrode E1, a second electrode E2, and an organic light emitting layer OEL disposed between the first electrode E1 and the second electrode E2. The transistor includes a semiconductor layer SM, a source electrode SE and drain electrode DE connected to opposite ends of the semiconductor layer SM, and a gate electrode GE disposed above and overlapping a center portion of the semiconductor layer SM According to an embodiment, the first electrode E1 is an anode electrode, and the second electrode E2 is a cathode electrode. The first electrode E1 is referred to as a pixel electrode, and the second electrode E2 is referred to as a common electrode.

According to an embodiment, the pixel PX is divided into a pixel area PA and a non-pixel area NPA in the vicinity of the pixel area PA. The organic light emitting element OLED is disposed in the pixel area PA, and the transistor TR is disposed in the non-pixel area NPA. The transistor TR and the organic light emitting element OLED are disposed on a substrate SUB. A buffer layer BFL is disposed on the substrate SUB, and the buffer layer BFL is made of an inorganic material.

According to an embodiment, the semiconductor layer SM of the transistor TR is disposed on the buffer layer BFL. The semiconductor layer SM includes an organic semiconductor or an inorganic semiconductor that includes amorphous silicon or poly-silicon. In addition, the semiconductor layer SM may include an oxide semiconductor. The semiconductor layer SM includes a source area connected to the source electrode SE, a drain area connected to the drain electrode DE, and a channel area between the source area and the drain area and that overlaps the gate electrode GE.

According to an embodiment, a first insulating layer INS1 is disposed on the buffer layer BFL and covers the semiconductor layer SM. The first insulating layer INS1 is made of an inorganic material. The gate electrode GE of the transistor TR that overlaps the semiconductor layer SM is disposed on the first insulating layer INS1. The gate electrode GE overlaps the channel area of the semiconductor layer SM.

According to an embodiment, a second insulating layer INS2 is disposed on the first insulating layer INS1 and covers the gate electrode GE. The second insulating layer INS2 is made of an organic material or an inorganic material.

According to an embodiment, the source electrode SE and drain electrode DE of the transistor TR are disposed spaced apart from each other on the second insulating layer INS2. The source electrode SE is connected to the source area of the semiconductor layer SM via a first contact hole CH1 formed in the first insulating layer INS1 and the second insulating layer INS2. The drain electrode DE is connected to the drain area of the semiconductor layer SM via a second contact hole CH2 formed in the first insulating layer INS1 and the second insulating layer INS2.

According to an embodiment, a third insulating layer INS3 is disposed on the second insulation layer INS2 and covers the source electrode SE and the drain electrode DE of the transistor TR. The third insulating layer INS3 is a planarization film and is made of an organic material.

According to an embodiment, the first electrode E1 is disposed on the third insulating layer INS3. The first electrode E1 is connected to the drain electrode DE of the transistor TR via a third contact hole CH3 formed in the third insulating layer INS3.

According to an embodiment, a pixel defining layer PDL that exposes a predetermined portion of the first electrode E1 is disposed on the first electrode E1 and the third insulating layer INS3. The pixel defining layer PDL includes an opening section PX_OP that exposes the predetermined portion of the first electrode E1.

According to an embodiment, the organic light emitting layer OEL is disposed on the first electrode E1 inside the opening section PX_OP. The organic light emitting layer OEL generates one of red, green, or blue light. However, embodiments of the inventive concept are not limited thereto, and the organic light emitting layer OEL can generate white light by a combination of organic materials that generate red, green, and blue light.

According to an embodiment, the second electrode E2 is disposed on the pixel defining layer PDL and the organic light emitting layer OEL. A thin film encapsulation layer TFE is disposed on the organic light emitting element OLED and covers the pixel PX. The layers between the substrate SUB and the thin film encapsulation layer TFE form a pixel layer PXL.

According to an embodiment, a first voltage ELVDD is transmitted to the first electrode E1, and a second voltage ELVSS is transmitted to the second electrode E2. A hole and an electron injected into the organic light emitting layer OEL couple to each other to form an exciton, and the organic light emitting element OLED emits light as the exciton transitions to a ground state. The organic light emitting element OLED emits red, green, or blue light according to a flow of current, whereby an image is displayed.

Figure 10:
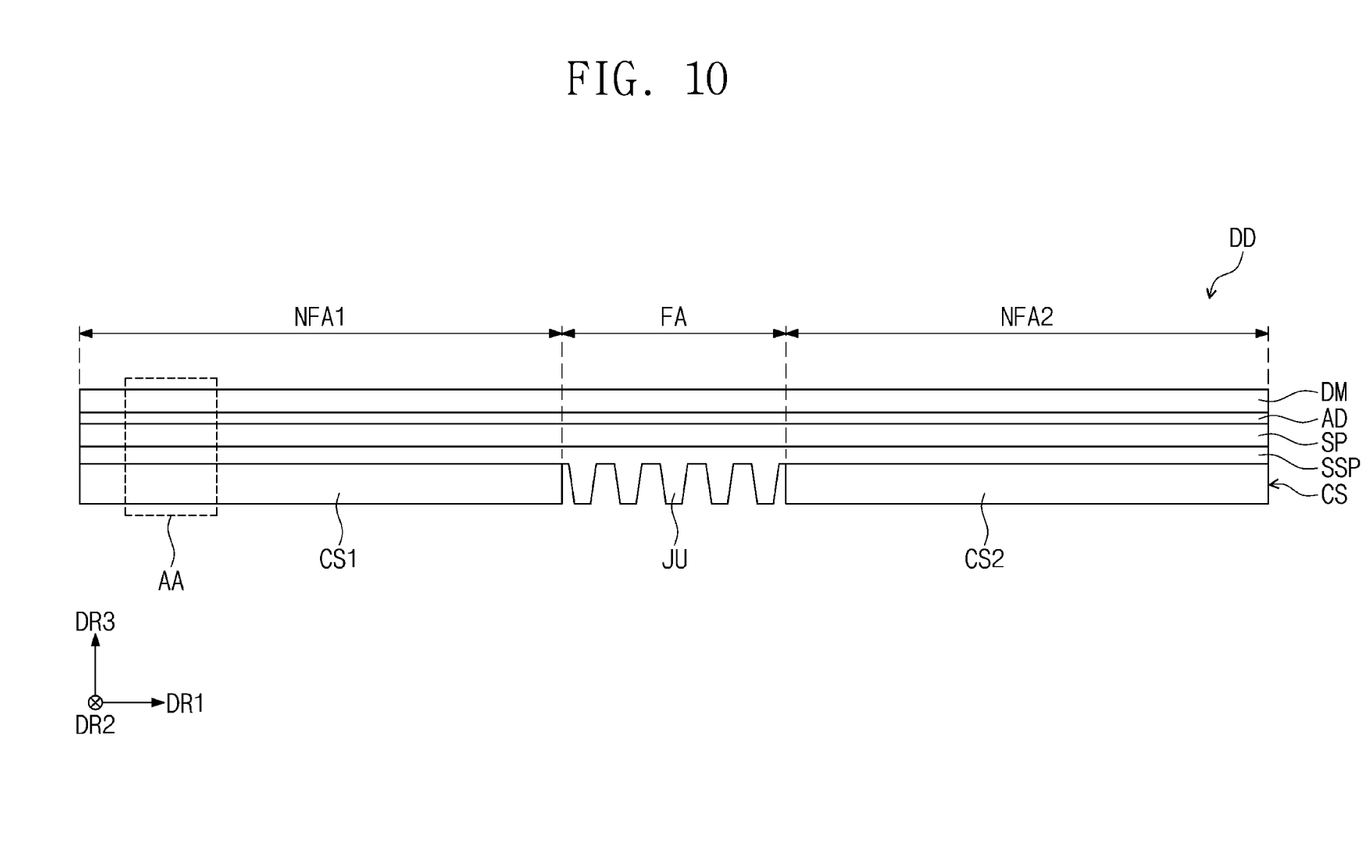
FIG. 10 is a side view of a display device illustrated in FIG. 5 when viewed in the second direction.

FIG. 10 is a side view of a display device illustrated in FIG. 5 when viewed in the second direction.

In FIG. 10, according to an embodiment, the display module DM, the adhesive AD, the supporter SP, the sub-supporter SSP, the joint units JU, and the case CS are illustrated in a coupled state.

Referring to FIG. 10, according to an embodiment, the supporter SP is attached to the display module DM by means of the adhesive AD. The support SP is disposed between the adhesive AD and the sub-supporter SSP. A Young's modulus of the supporter SP has a first value. The Young's modulus is a coefficient of elasticity that indicates a ratio of stress and strain.

According to an embodiment, the sub-supporter SSP is coated on the bottom surface of the supporter SP, which is opposite to the top surface of the supporter SP attached to the adhesive AD. The sub-supporter SSP is not attached to the bottom surface of the supporter SP by means of an additional adhesive. The sub-supporter SSP is directly coated on the supporter SP and attached to the supporter SP.

According to an embodiment, the Young's modulus of sub-supporter SSP has a second value less than the first value. For example, the supporter SP includes a metal, and the sub-supporter SSP includes a plastic. The Young's modulus of the metal has a greater value than the Young's modulus of the plastic.

According to an embodiment, the supporter SP is made of an invar that is an alloy of an iron and nickel, but this is exemplary and non-limiting. The supporter SP may include various other metals. The sub-supporter SSP is made of polyimide (PI), but this is exemplary and non-limiting, and the sub-supporter SSP may include various other plastic materials.

According to an embodiment, the joint units JU are disposed between the first case CS1 and the second case CS2. A width in the first direction DR1 of each of the joint units JU decreases downward from upper portions of the joint units JU. For example, when viewed in the second direction DR2, each of the joint units JU has a reverse trapezoidal shape.

However, this is exemplary and non-limiting, and the joint units JU can have various other shapes as long as the width of each of the joint units JU decreases downward from upper portions of the joint units JU.

According to an embodiment, the joint units JU are made of the same material as the sub-supporter SSP. The joint units JU are integrated with the sub-supporter SSP. The joint units JU protrude downward from a portion of the sub-supporter SSP that overlaps the folding area FA.

According to an embodiment, the sub-supporter SSP and the joint units JU are formed at the same time, using the same material. However, embodiments of the inventive concept are not limited thereto, and in other embodiments, the joint units JU are manufactured separately and are attached to a lower portion of the sub-supporter SSP.

According to an embodiment, the first and second cases CS1 and CS2 are connected to the supporter SP. This configuration will be described in detail below with reference to FIG. 12.

Figure 11:
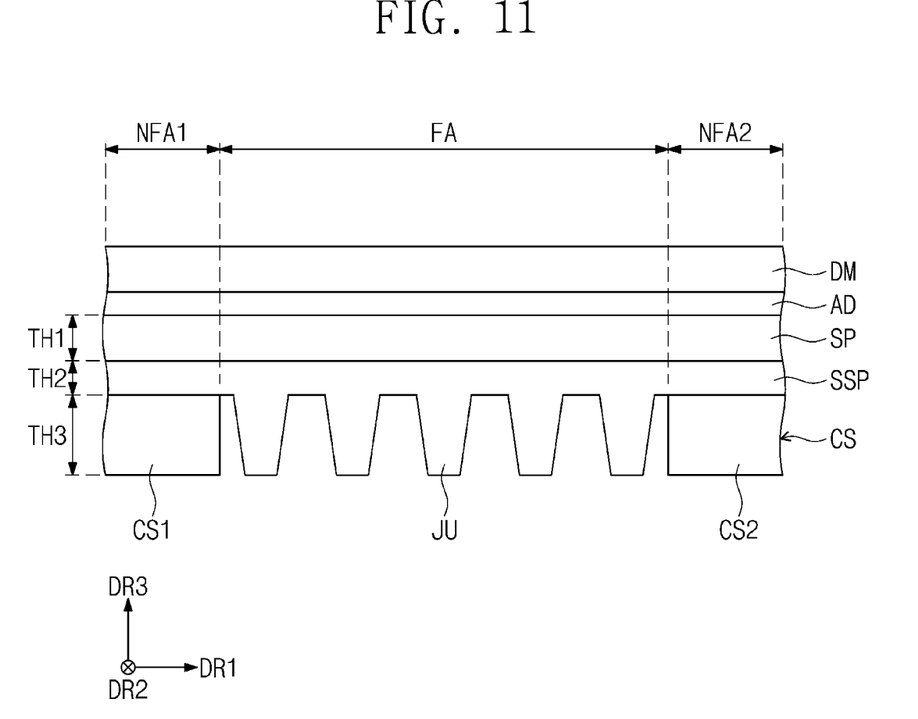
FIG. 11 is an enlarged view of a folding area, a supporter that overlaps the folding are, and a sub-supporter that overlaps the folding area, and joint units illustrated in FIG. 10.

FIG. 11 is an enlarged view of a folding area, a supporter that overlaps the folding area, and a sub-supporter that overlaps the folding area, and joint units illustrated in FIG. 10.

Referring to FIG. 11, according to an embodiment, the supporter SP has a first thickness TH1 in a third direction DR3, and the sub-supporter SSP has a second thickness TH2 less than the first thickness TH1. Each of the first and second cases CS1 and CS2 has a third thickness TH3 in the third direction DR3 greater than the second thickness TH2.

According to an embodiment, when a metallic supporter SP is thick, folding the display device DD may be challenging. Thus, a thickness of the supporter SP is adjusted so that the display device DD can be easily folded. For example, the first thickness TH1 is from about 40 μm to about 50 μm.

According to an embodiment, the thickness TH3 in the third direction DR3 of each of the joint units JU is the same as that of the first and second cases CS1 and CS2. However, this is exemplary and non-limiting, and in other embodiments, the thickness of each of the joint units JU differs from that of each of the first and second cases CS1 and CS2.

Figure 12:
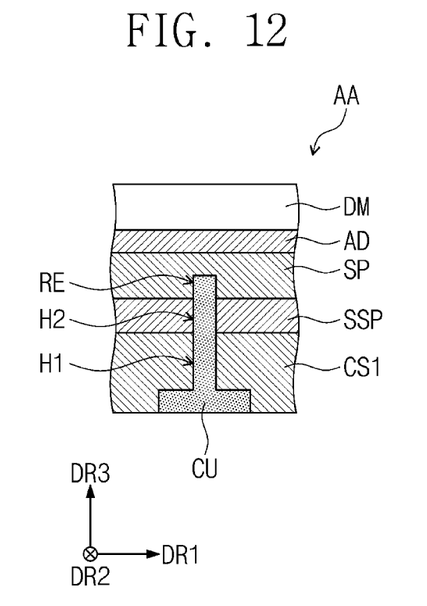
FIG. 12 schematically illustrates a cross-section of region AA illustrated in FIG. 10.

FIG. 12 schematically illustrates a cross-section of region AA illustrated in FIG. 10.

Referring to FIG. 12, according to an embodiment, the first case CS1 is connected to the supporter SP by means of a coupling unit CU. A first hole H1 is formed in the first case CS1, and a second hole H2 that overlaps the first hole H1 is formed in the sub-supporter SSP. A recess part RE that overlaps the second hole H2 is formed in the bottom surface of the supporter SP.

According to an embodiment, the coupling unit CU is inserted into the first hole H1, the second hole H2, and the recess part RE, and connects the first case CS1 to the sub-supporter SSP and the supporter SP. The coupling unit CU may be a screw. A plurality of coupling units CU, first holes H1, second holes H2 and recess parts RE are provided in the first case CS1, the sub-supporter SSP and the supporter SP, respectively.

In addition, according to an embodiment, the second case CS2 is also connected to the support SP by means of the coupling unit CU. For example, a first hole H1 is formed in the second case CS2, and a second hole H2 that overlaps the first hole H1 and a recess part RE are formed in the sub-supporter SSP and in the bottom surface of the supporter SP, respectively.

According to an embodiment, the coupling unit CU is inserted into the first hole H1, the second hole H2, and the recess part RE to connect the second case CS2 to the sub-supporter SSP and the supporter SP. A plurality of coupling units CU, first holes H1, second holes H2 and recess parts RE are provided in the second case CS2, the sub-supporter SSP and the supporter SP, respectively.

According to an embodiment, the first and second cases CS1 and CS2 are connected to the sub-supporter SSP and the supporter SP by means of the coupling units CU, but embodiments of the inventive concept are not limited thereto. In other embodiments, an additional adhesive is disposed between the first and the second cases CS1 and CS2 and the sub-supporter SSP, and the first and second cases CS1 and CS2 are connected to the sub-supporter SSP by means of the adhesive.

Figure 13:
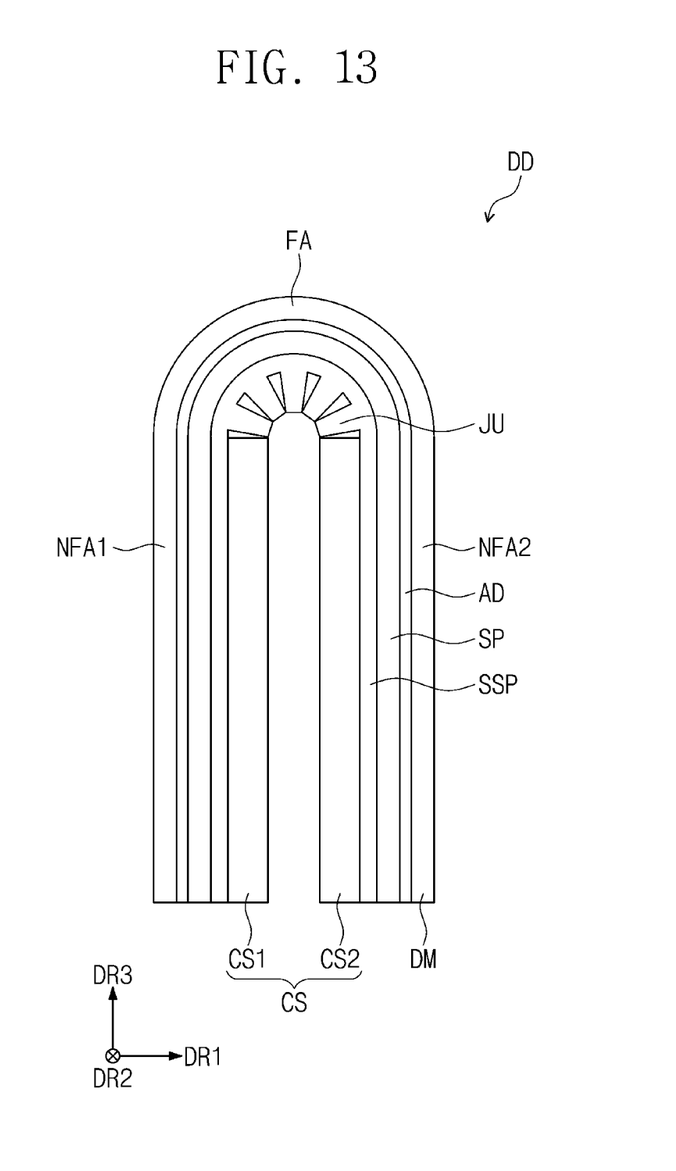
FIG. 13 illustrates a folded state of a display device illustrated in FIG. 10.

FIG. 13 illustrates a folded state of a display device illustrated in FIG. 10.

Referring to FIG. 13, according to an embodiment, the first case CS1 and the second case CS2 move by means of a hinge part to face each other. The supporter SP and the sub-supporter SSP move along with the first case CS1 and the second case CS2, and the display module DM is outfolded to be externally exposed. When the display device DD is folded, side surfaces of the joint units JU are disposed adjacent to each other. Both sides of lower ends of the joint units JU can be in contact with each other. Upper ends of the joint units JU are spaced apart from each other.

According to an embodiment, the joint units JU are not attached to the display module DM by means of the adhesive AD. If the joint units JU are manufactured individually and attached to the display module DM by means of the adhesive AD, compressive stress generated between the neighboring joint units JU when folded is transferred to the display module DM, whereby the display module DM can be deformed.

In an embodiment of the inventive concept, the metallic supporter SP with a large Young's modulus is disposed below the display module DM, so that compressive stress generated by the joint units JU when folded is not transferred to the display module DM. The compressive stress is not transferred to the display module DM and is isolated.

During the folding operation, according to an embodiment, stress is generated in a portion of the display device DD that overlaps the folding area FA. However, in an embodiment of the inventive concept, the plastic sub-supporter SSP with a low Young's modulus is disposed below the supporter SP. The sub-supporter SSP is flexible and can relieve the stress.

Consequently, the display device DD according to embodiments of the inventive concept can prevent deformation of the folding area FA due to compressive stress.

A display device according to an embodiment of the inventive concept can prevent compressive stress generated in the joint units from being transferred to the folding area of the display module, and thus prevent the folding area from being deformed due to the compressive stress by relieving the compressive stress generated in the joint units.

Although exemplary embodiments of the present disclosure have been described, it is understood that various changes and modifications can be made by one of ordinary skill in the art within the spirit and scope of embodiments of the present disclosure as hereinafter claims. In addition, exemplary embodiments described in the present disclosure are not intended to limit the technical ideas of the present disclosure, and all technical ideas within the following claims and their equivalents should be interpreted to be included in the scope of right in the present disclosure.

What is claimed is:

1. A display device, comprising:
   a display module that includes a first non-folding area, a second non-folding area, and a folding area disposed between the first non-folding area and the second non-folding area arranged in a first direction;
a supporter disposed below the display module;
a sub-supporter disposed below the supporter; and
a plurality of joint units disposed below the sub-supporter, extend in a second direction that crosses the first direction, and that overlap the folding area,
wherein the sub-supporter and the joint units are integrally formed with each other under the folding area that includes pixels,
wherein a thickness in a third direction of the sub-supporter is less than that of the supporter, and
wherein the third direction is perpendicular to a plane defined by the first and second directions.

2. The display device of claim 1, further comprising an adhesive disposed between the display module and the supporter.

3. The display device of claim 1, wherein
a Young's modulus of the supporter has a first value, and
a Young's modulus of the sub-supporter has a second value less than the first value, and the sub-supporter is coated on a bottom surface of the supporter.

4. The display device of claim 1, wherein
each of the sub-supporter and the joint units includes a plastic.

5. The display wherein the supporter includes a metal.

6. The display device of claim 1, wherein the joint units are spaced a predetermined distance from each other in the first direction.

7. The display device of claim 1, wherein each of the joint units has a reverse trapezoidal shape when viewed in the second direction.

8. The display device of claim 1, wherein the supporter has a thickness of from about 40 micrometers to about 50 micrometers in the third direction.

9. The display device of claim 1, wherein
when the display module is out-folded and externally exposed,
the folding area is curved with respect to a folding axis parallel to the second direction.

10. The display device of claim 1, further comprising:
a first case disposed below the sub-supporter and that overlaps the first non-folding area; and
a second case disposed below the sub-supporter and that overlaps the second non-folding area.

11. The display device of claim 10, wherein the joint units are disposed between the first case and the second case.

12. The display device of claim 10, further comprising a plurality of coupling units that connect the first and second cases to the supporter.

13. The display device of claim 12, wherein the coupling units are inserted into first coupling holes formed in each of the first and second cases, second coupling holes formed in the sub-supporter and that are continuations of the first coupling holes into the sub-supporter, and recess parts formed in the bottom surface of the supporter and that are continuations of the second coupling holes into the supporter.

14. The display device of claim 10, further comprising an adhesive that attaches the first and second cases to the sub-supporter.

15. A display device, comprising:
a display module that includes a first non-folding area, a second non-folding area, and a folding area disposed between the first non-folding area and the second non-folding area, wherein the first and second non-folding areas and the folding area are arranged in a first direction;
a supporter disposed below the first non-folding area, the second non-folding area, and the folding area of the display module;
an adhesive disposed between the display module and the supporter;
a sub-supporter disposed below the supporter; and
a plurality of joint units which protrude downward from the sub-supporter and that overlap the folding area, wherein the joint units extend in a second direction that Crosses the first direction and are spaced apart in the first direction,
wherein a thickness in a third direction of the sub-supporter is less than that of the supporter, and
wherein the third direction is perpendicular to a plane defined by the first and second directions.

16. The display device of claim 15, wherein
a Young's modulus of the supporter has a first value,
a Young's modulus of the sub-supporter has a second value less than the first value, and the sub-support is coated on a bottom surface of the supporter, and
wherein the sub-supporter and the joint units are integrally formed with each other under the folding area that includes pixels.

17. A display device, comprising:
a display module that includes a first non-folding area, a second non-folding area, and a folding area disposed between the first non-folding area and the second non-folding area arranged in a first direction;
a supporter disposed below the first non-folding area, the second non-folding area, and the folding area of the display module;
a sub-supporter disposed below the supporter; and
a plurality of joint units which protrude downward from the sub-supporter, extend in a second direction that crosses the first direction, and that overlap the folding area,
wherein a Young's modulus of the supporter has a first value and a Young's modulus of the sub-supporter has a second value less than the first value,
wherein the sub-supporter and the joint units are integrally formed with each other,
wherein a thickness in a third direction of the sub-supporter is less than that of the supporter, and
wherein the third direction is perpendicular to a plane defined by the first and second directions.

18. The display device of claim 17, further comprising an adhesive disposed between the display module and the supporter,
wherein the sub-support is coated on a bottom surface of the supporter, and the joint units are spaced apart in the first direction.

* * * * *